United States Patent [19]

Maeda et al.

[11] 4,360,043

[45] Nov. 23, 1982

[54] COMPONENT LEAD WIRE CUTTING EQUIPMENT

[75] Inventors: Yoshinobu Maeda; Fumikazu Taniguchi, both of Katano; Kazuhiko Narikiyo, Neyagawa, all of Japan

[73] Assignee: Matsushita Electric Industrial Co., Ltd., Osaka, Japan

[21] Appl. No.: 122,076

[22] Filed: Feb. 15, 1980

[30] Foreign Application Priority Data

Feb. 15, 1979 [JP] Japan .................................. 54/17021

[51] Int. Cl.³ ............................................. H05K 3/32
[52] U.S. Cl. ....................................... 140/105; 83/694
[58] Field of Search .................... 29/564.6, 739, 741; 140/105, 139; 83/694

[56] References Cited

U.S. PATENT DOCUMENTS 3,257,711 6/1966 Rijsewijk .......................... 29/741 X
3,988,815 11/1976 Petree ................................ 29/741 X
4,051,593 10/1977 Mori et al. ........................ 29/741 X

*Primary Examiner*—G. Weidenfeld
*Assistant Examiner*—K. J. Ramsey
*Attorney, Agent, or Firm*—Wenderoth, Lind & Ponack

[57] ABSTRACT

A component lead wire cutting equipment includes upper and lower levers for gripping a pair of lead wires of an electric component extending in the same direction. A driving device moves the levers. A pair of cutter blades are mounted on the levers to spread the pitch of the lead wires to a given size, and to cut off the lead wires. A pair of regulating convex portions regulate the movement of the lead wires along their spreading direction in the position between the cutter blades and the component body. During the cutting operation of the lead wires the component is prevented from being broken or from being inclined in its body.

8 Claims, 15 Drawing Figures

Fig. 5
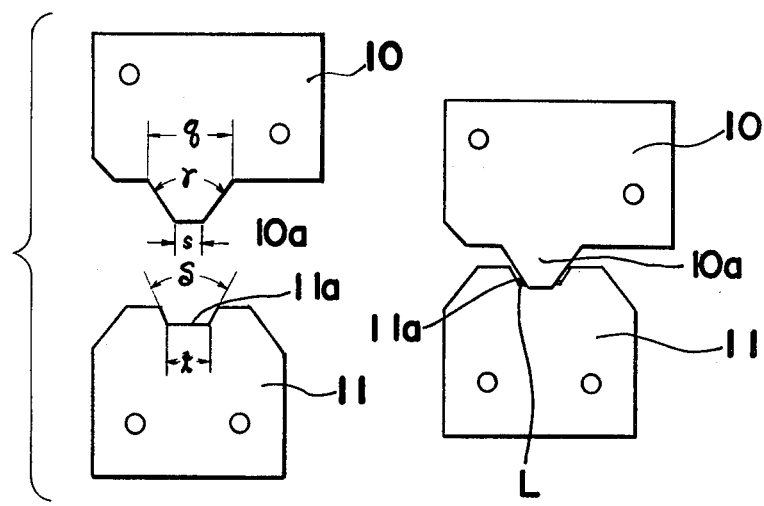
Fig. 6
Fig. 7 PRIOR ART
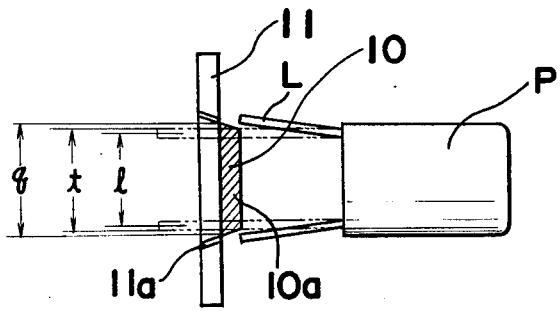
Fig. 8
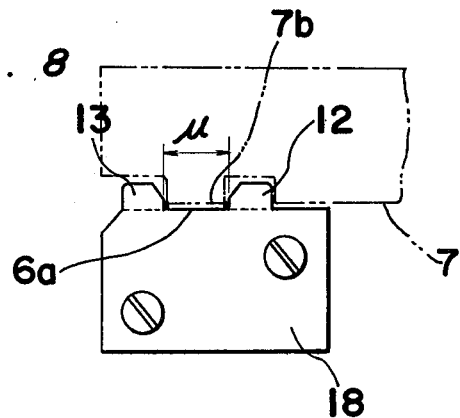

Fig. 12 PRIOR ART
Fig. 13 PRIOR ART
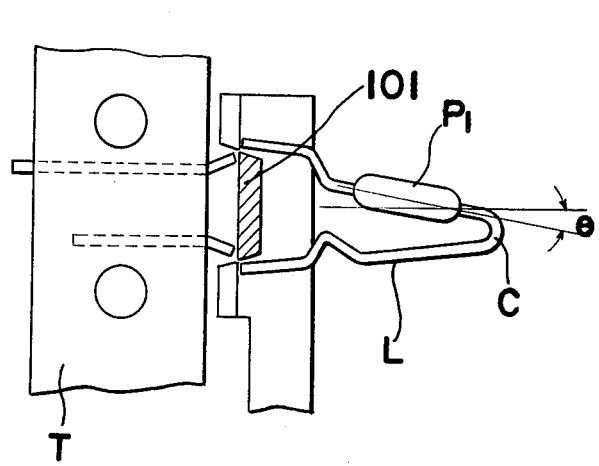
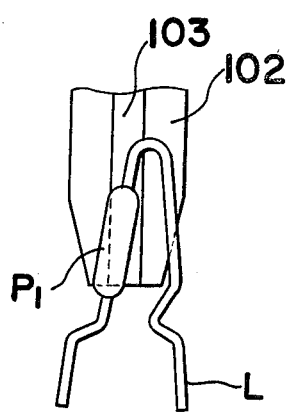
Fig. 14
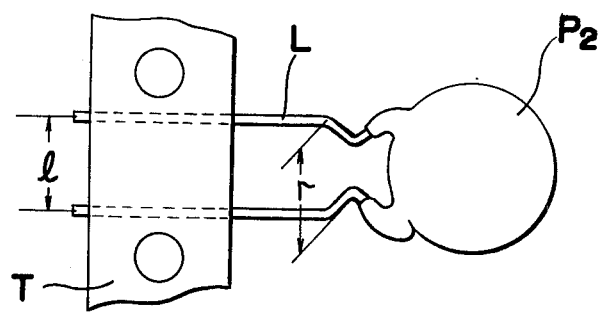
Fig. 15 PRIOR ART
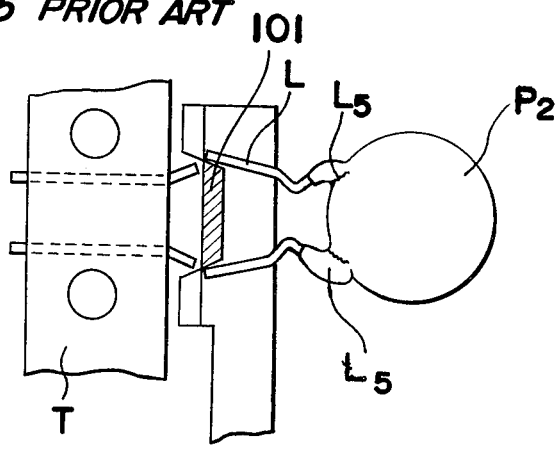

COMPONENT LEAD WIRE CUTTING EQUIPMENT

BACKGROUND OF THE INVENTION

The present invention relates to a component lead wire cutting equipment for use with an electric component inserting apparatus which is adapted to automatically insert components, each having its lead wires extending in the same direction, i.e., various electric components of different shapes such as a ceramic condenser, an electrolytic condenser, a vertical resistor or the like, into given holes of a circuit board after cutting extra portions of the lead wires and shaping the remaining end portions of the cut lead wires.

In an automatic inserting apparatus for inserting, into given holes provided in a circuit board, separated electric components, the electric components P being cut off at their lead wires L to cut off the electric components of the above-described types from a tape T with the electric components retained thereon, a process for forming the lead wires L to the same pitch as the given pitch of the holes in the circuit board N is required as a pre-stage before the subsequent stage where the lead wires of the component are inserted into the circuit board. Accordingly, the lead wires L of the electric component P to be fed with the lead wire L thereof being loose after being cutting off from the tape T are required to be once expanded and then to be narrowed to a given pitch again from the expanded condition so that the pitch of the lead wires may be corrected.

In such electric component inserting apparatus, as the convex cutting edge 101 of the cutting equipment W is adapted to spread the lead wires L during the cutting-off operation of such component P1 as shown in FIG. 11, the body of which is not symmetrical, such as a vertical resistor or the like, the lead wire L is bent at its center point C as a pivot point for the spreading. Thus, the body of the component P1 is inclined at an angle $\theta$ with respect to the original condition of the lead wire as shown in FIG. 2 at the time of cutting off from the tape T so that it cannot enter the groove portion 103 of a chuck lever of a mounting equipment 102 at a subsequent process, thus making the chucking operation unstable. Also, when a component P2 whose body diameter is small as shown in FIG. 14 is cut off, the convex cutting edge 101 is also adapted to spread the lead wires L while applying unnecessary force to the root portions L5 of the lead wires, thus resulting in making cracks of the coating provided on the body and lead wires as shown in FIG. 15.

SUMMARY OF THE INVENTION

The present invention provides a cutting equipment for cutting and shaping the lead wires of a component having a construction as shown in FIGS. 11 or 14, while avoiding the above-described problems.

It is accordingly a principal object of the present invention to provide a cutting equipment which can prevent the component body from being broken during the cutting-off operation of the component lead wires.

It is another object of the invention to provide a cutting equipment which can prevent the lead wires from being deformed more than necessary or the body posture from being inclined during the cutting-off operation of the component lead wires, thereby to avoid undesired influences upon the subsequent process.

According to the present invention, there is provided a component lead wire cutting equipment comprising upper and lower levers for gripping the lead wires of components each having two lead wires extending in the same direction, a driving means for moving the upper and lower levers to come into contact against each other or to separate from each other, a pair of cutter blades mounted respectively on the upper and lower levers to spread the pitch of the lead wires of the electric components to a given size to cut off the end portions of the lead wires, and a pair of regulating convex portions for regulating the movement of the lead wires along their spreading directions on the side where the component body is located with respect to the cutter blades and in the position between the cutter blades and the component body. The inner sides of the regulating convex portions are spaced by a distance equal to or somewhat greater than the outer side space of the lead wires in the original given pitch. By the provision of the regulating convex portions adapted to restrict the movement of portions of the lead wires near to the body of the component during the cutting off and shaping operation of the lead wires, no inclination is caused in the body of the component and no plastic or ceramic coating cracks are caused in the lead wire roots of the component.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 5 is a side view of a pair of cutting edges of the cutter unit of FIG. 4;

FIG. 6 is a side view showing the cutting condition of the lead wires by the pair of cutting edges of FIG. 5;

FIG. 7 is a top plan view illustrating the relationship between the component and the cutting edges during the cutting-off operation;

FIG. 8 is a side view showing regulating convex portions provided on a lever of the cutter unit of FIG. 4;

FIG. 12 is a plan view illustrating a condition where the vertical resistor has been cut off by the cutting edges of a cutting equipment not equipped with regulating convex portions;

FIG. 13 is a plan view illustrating the chucking condition of the cut-off vertical resistor of FIG. 12 into a chuck of the component mounting equipment;

FIG. 14 is a plan view of a taped ceramic condenser, whose body is bisymmetrical; and FIG. 15 is a plan view illustrating a condition where the ceramic condenser has been cut off by the cutting edges of a cutting equipment not equipped with regulating convex portions.

DETAILED DESCRIPTION OF THE INVENTION

Figure 1:
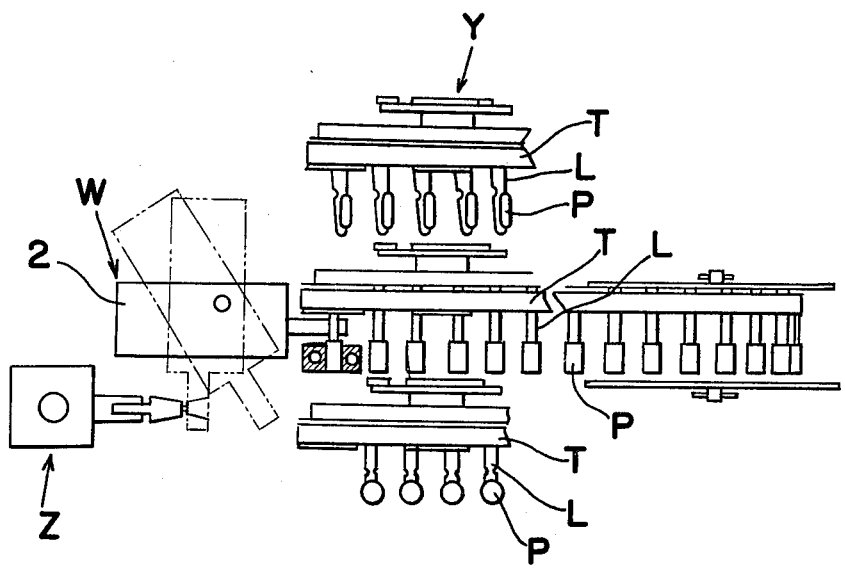
FIG. 1 and FIG. 2 are a plan view and a side view of essential portions of a component lead wire cutting equipment of the present invention in association with a component feed equipment and a component mounting equipment for an automatic electric component inserting apparatus, respectively.

Before the description of the present invention proceeds, it is to be noted that like parts are designated with the same reference numerals throughout the drawings.

Figure 2:
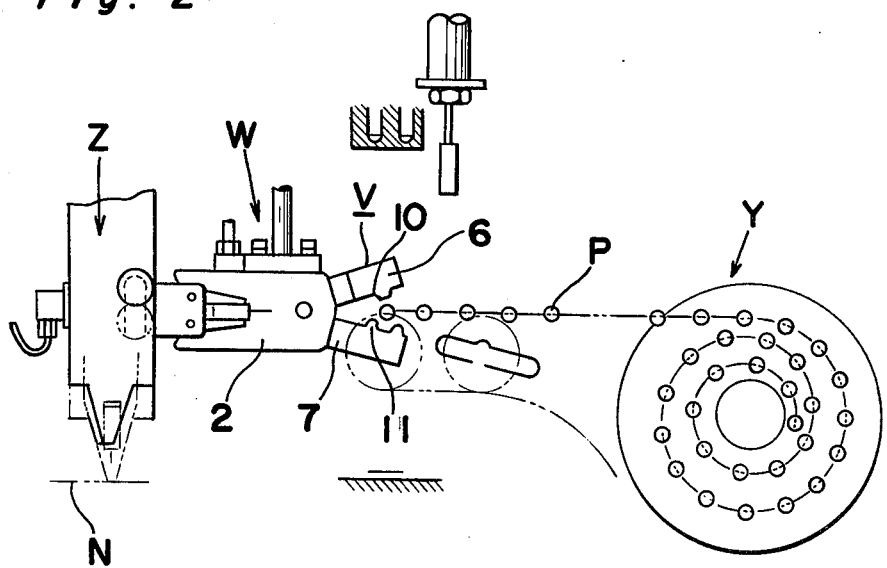
Figure 9:
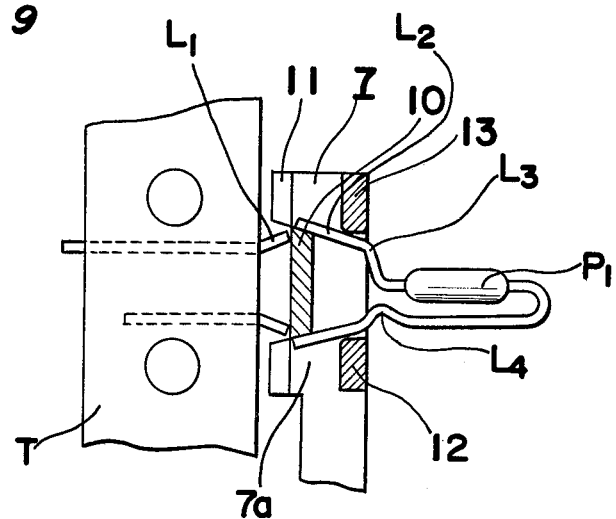
FIG. 9 and FIG. 10 are top plan views, partially broken away, illustrating the relationship among the component, cutting edges and regulating convex portions during the cutting-off operation for lead wires of components comprising a vertical resistor and a ceramic condenser, respectively.
Figure 10:
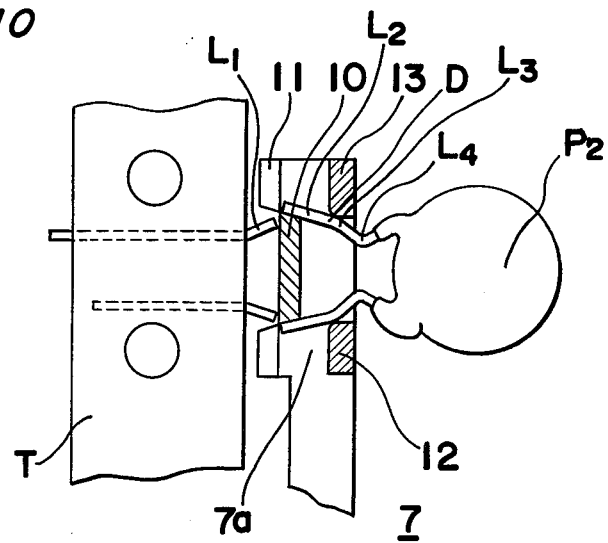

FIG. 1 and FIG. 2 show a cutting equipment W for lead wires, according to the present invention, which comprises a cutter unit V having a pair of levers 6, 7 with cutter blades 10, 11 having cutting edges for cutting leg portions L1 (FIGS. 9, 10) of lead wires L of a component P, a drive means for operating the cutter unit so as to open or close the levers 6, 7 and to regulate means 12, 13 for keeping in a given position the shoulder portions L3 of lead wires L during the cutting operation of the cutter unit, in association with a feeding equipment Y of a known construction for feeding in succession of a tape T the components P having the lead wires L to be cut to the cutter unit of the cutting equipment W, a mounting equipment Z of a known construction for receiving the component having the cut-off lead wires from the cutter unit of the cutting equipment W to mount the component P onto a circuit board N and a control circuit (not shown) for controlling the operation of all the above equipments W, Y, Z in a known manner. The component P of a known construction having a pair of lead wires L each extending substantially in the same direction with respect to each other and including a neck portion L4 connected to the component, shoulder portion L3, trunk portion L2 and leg portion L1 to be cut, is transferred from the feeding equipment Y to the mounting equipment Z through the cutting equipment W in which the leg portion L1 of lead wires L are cut-off and the trunk portions L2 are formed to plastic figures by means of the cutter unit V in accordance with the present invention.

Figure 3:
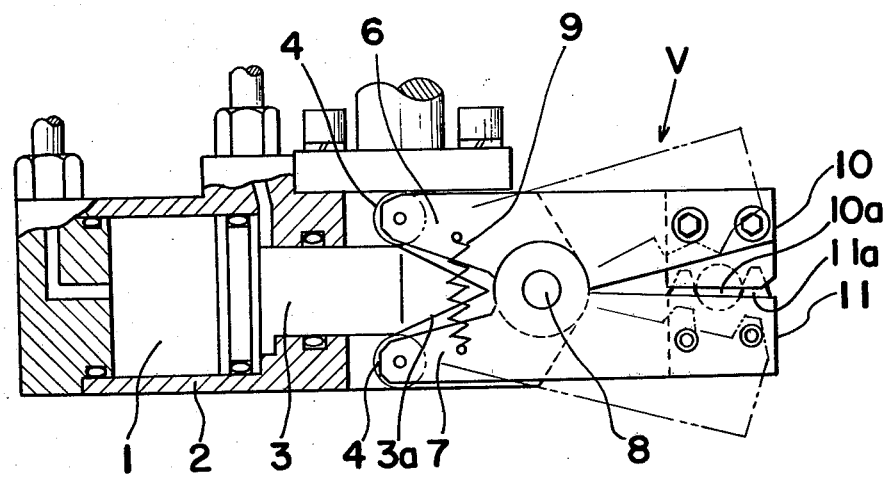
FIG. 3 is a side elevational view, partially cross-sectioned, showing essential portions of a lead wire cutting equipment of one embodiment of the present invention.

FIG. 3 shows a cutter unit body 2 which constitutes a cylinder 1 for a piston 3. The piston 3 is slidably incorporated within the cutter unit body 2 to reciprocate by air to be introduced into the cylinder in a known manner and has at its end a head portion 3a which is projected outwardly from the cylinder while having a conical face at its outer end so as to constitute the driving means for the cutter unit. The cutter unit V is also provided on the cutter unit body 2 in association with the piston 3 in such a manner that the head portion 3a of the piston 3 always comes into contact with a pair of rollers 4, 4 provided on the pair of levers 6, 7 of the cutter unit in order to open or close the levers 6, 7. The cutter unit V comprises the pair of upper and lower levers 6, 7 which are together pivotally mounted by a pin 8 at their middle portions on the cutter unit body 2 to form a pair of scissors provided with the pair of cutter blades 10, 11 at the tip ends and the pair of rollers 4, 4 at the other ends, and a spring 9 provided between the pair of levers 6, 7 to urge the pair of rollers 4, 4 into contact with the head portion 3a of the piston 3. The cutter unit V is actuated in accordance with the positioning of the piston 3 such that, when the piston 3 is extended to project the head portion 3a outwardly, the pair of rollers 4, 4 are separated against the force of spring 9 by contact with the widening portions of the conical face to close the pair of levers 6, 7 while moving the pair of cutter blades 10, 11 toward each other as shown by the solid lines in FIG. 3, while, when the piston 3 is retracted to move the head portion 3a inwardly, the pair of rollers 4, 4 are moved toward each other by the tension force of spring 9 while contacting the narrowing portions of the conical face to open the pair of levers 6, 7 while separating the pair of cutter blades 10, 11 from each other as shown by the dashed lines in FIG. 3. One of the cutter blades 10, 11 provided at the inner tip ends of the levers 6, 7 is provided with a convex portion 10a of trapezoid shape having dimensions of large base width q, small tip width s and expanding angle $\gamma$ as shown in FIG. 5, while the other of the cutter blades is also provided with a counterpart concave portion 11a of trapezoid shape having dimensions of middle bottom width t and reducing angle $\sigma$. The bottom width t of concave 11a is smaller than the base width q of convex portion 10a and larger than the outer side distance or the pitch 1 (FIG. 11) between a pair of lead wires L, not cut, of an electric component P, at their expanding sides, which is larger than the top width s of convex 10a, and the reducing angle $\sigma$ is smaller than the expanding angle $\gamma$. In each of the cutter blades cutting edges, for cutting lead wires L are respectively provided along a pair of tapered portions of the trapezoid shapes of to the convex 10a and concave 11a, as shown in FIG. 6. When the lead wires L of the component P are cut-off by closing the pair of cutter blades 10, 11, the inner side distance between the lead wires L of the component P in their cut-position is plastically deformed to be correctly retained at the dimension of the base width q of the convex 10a, as shown in FIG. 7, and the remaining lead wires L of the component P are adapted to be gripped firmly between the cutting edges of the cutter unit V even after the other cut-off portions of the lead wires L have been removed from the cutting cutter blades 10, 11, as shown in FIG. 6.

Figure 4:
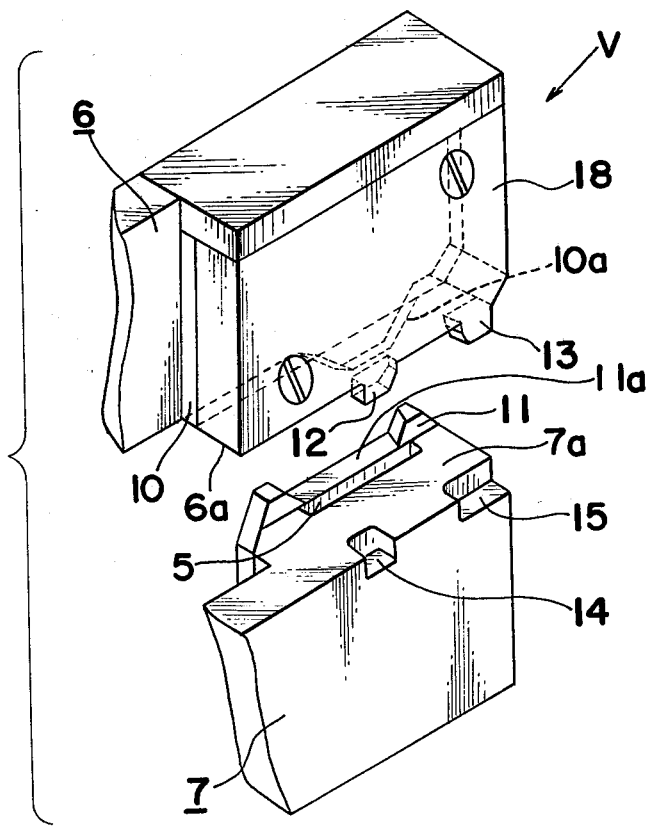
FIG. 4 is a perspective view, on an enlarged scale, showing cutter portions of a cutter unit employed in the cutting equipment of FIG. 3.

The pair of cutter blades 10, 11 are respectively formed of plates having cutting edges to be attached to the inner sides of levers 6, 7. The upper lever 6 is provided with not only the cutter blade 10 having the convex 10a forming cutting edges, but also a press portion 6a of an attached plate 18 provided with a pair of convex projections 12, 13 for regulating the positioning of lead wires L of the component P on the lever 6, while the lower lever 7 is provided with not only the cutting blade 11 having the concave 11a forming cutting edges, but also a die portion 7a provided with a pair of concave grooves 14, 15 each for receiving the counterpart convex projections and a slot 5 for receiving the convex 10a of cutter blade 10, as shown in FIG. 4.

With the above construction of the cutter unit V having the pair of cutter blades 10, 11 each provided on the respective lever 6, 7 in facing relation to the other, the cutting edges of the concave and convex 10a, 11a constitute a cutter for cutting lead wires L. The pair of convex projections 12, 13 are inserted into the concave grooves 14, 15 for regulating lead wires L therewith, and the press portion 6a and the die portion 7a provide a chuck for gripping the lead wires therebetween. The pair of convex projections 12, 13 are respectively formed of a configuration of almost trapezoid shape and are arranged to be spaced by a distance $\mu$ between their inner sides in correspondence with the concave 11a, the distance μ being set to be approximately equal to or somewhat greater than the outer side distance r between the shoulder portions L3 of lead wires L of the component P. Also, the pair of convex projections 12, 13 are provided to keep or retrict the shoulder portions L3 or portions near to the shoulder portions L3 of lead wires L within a given position along their inner slope portions during the operation to cut-off the leg portions L1 from the trunk portions L2 of lead wires L, thereby to prevent the over-spreading of the distance between the shoulder portions L3 of the lead wires upon forming to make the distance of the trunk portions L2 of lead wires widen by means of cutter blades 10, 11. The distance between the cutter blades 10, 11 and projections 12, 13 disposed through the press and die portions 6a, 7a is almost the same size as the length of the trunk portion L2 of lead wires L. The press portion 6a and die portions 7a are adapted to hold the trunk portions L2 of lead wires L therebetween during and after cutting off of the leg portions L1 while regulating the positions of the shoulder portions L3 by means of projections 12, 13. The cutter blades 10, 11 and projections 12, 13 are normally designed to have rounded or slanting portions at the corners or side ends thereof to guide smoothly the lead wires L along the tapered portions and slope portions, respectively.

Figure 11:
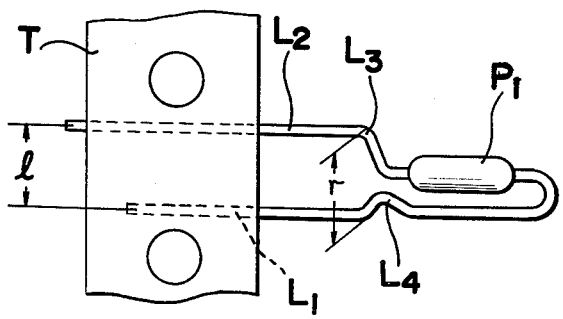
FIG. 11 is a plan view showing a vertical resistor taped, whose body is not symmetrical.

The lead wires L of component P are not only cut-off to a certain size at the leg portions L1 but also are formed to a special shape at the trunk portions L2 by means of cutter blades 10, 11 while maintaining the shoulder portions L3 at given positions by means of projections 12, 13, and the lead wires are held at the trunk portions L2 between the press and die portions 6a, 7a, within one cycle of operation of the cutter unit driven by the piston 3. When the pair of levers 6, 7 are opened to separate the cutter blades 10, 11 from each other by the retraction of the piston 3, a component P is fed from the feeding equipment Y at a cutting-off position of the cutter unit V of the cutting equipment W in such a manner that the pair of lead wires L of the component P are placed between the cutter blades 10, 11 of the levers 6, 7 while positioning the shoulder and trunk portions L3, L2 thereof over the die portion 7a, and leg portions L1 to be cut over the concave 11a of the cutter blade 11. Accordingly, the free expanding sides of lead wires L are positioned to extend from the die portion 7a disposed between and near the pair of grooves 14, 15 to the middle portion of the bottom of the concave 11a apart from the pair of tapered edges defining the concave 11a. Then, the piston 3 is moved outwardly to close the pair of levers 6, 7 through the pair of rollers 4, 4 containing the widened portions of the conical face of the projected head portion 3a. When the cutter blades 10, 11 are brought into contact with each other by closing of the levers 6, 7, the outer end of the convex 10a of the upper cutter blade 10 is at first inserted between the leg portions L1 of lead wires L of the component P, and the leg and trunk portions L1, L2 of lead wires L are shifted in succession along the tapered portions of convex 10a of the upper cutter blade 10 under guidance of the bottom portion of concave 11a of the lower cutter blade 11 so as to spread the distance l between the leg and trunk portions L1, L2 of lead wires L until the leg and trunk portions L1, L2 are sufficiently separated to be at the respective corners of the inner portion of concave 11a at a distance t to form a special shape, while the shoulder portions L3 of lead wires L are contacted by and guided along the inner sloped portions of projections 12, 13 of the lever 7 to maintain the distance r between the shoulder portions L3 within a range of the given space μ between the inner sloped portions of the projections 12, 13, thereby to prevent the lead wires L from over-spreading at the shoulder portions L3 thereof. As the upper cutter blade 10 having the convex 10a contacting the inner sides of the leg portions L1 of lead wires L advances toward the lower cutter blade 11 having the concave 11a contacting the outer sides of the leg portions L3 of lead wires L, to eliminate the gap between the taper portions of the convex 10a and the concave 11a, the leg portions L1 of lead wires L of component P are cut off from the trunk portions L2 of lead wires L by shearing of cutting edges formed on the tapered portions of convex 10a and concave 11a. The component P is held on the cutter unit V by grasping of the trunk portions L2 of lead wires L between the press and die portions 6a, 7a of the levers 6, 7, and, then, is transferred to the mounting equipment Z. During the cutting operation of the cutter blades 10, 11, the projections 12, 13 of the upper lever 6 are adapted to regulate the position of the shoulder portions L3 of lead wires L in cooperation with the grooves 14, 15 of the lower lever 7. At the completion of the cutting operation, the convex 10a of upper cutter blade 10 is overlapped with the concave 11a of lower cutter blade 11 and is received within the slot 5 of the lower lever 7, while the projections 12, 13 of upper lever 6 are received within the respective grooves 14, 15 of the lower lever 7. When the piston 3 is retracted again, the component P is easily picked up from the cutter unit V by the mounting equipment Z upon opening of the upper and lower levers 6, 7, and, subsequently, the next component is fed from the feeding equipment Y to the cutting-off positions of the cutting equipment W as mentioned above. The above one cycle of a cutting operation may be applied to not only a component P1, such as a vertical resistor having a body which is not symmetrical as shown in FIG. 11, but also a component P2 such as a ceramic condenser having a body of small diameter as shown in FIG. 14.

With the above description of an embodiment according to the present invention, it is clear that by the provision on upper lever 6 of projections 12, 13 the inner sides of which are spaced by distance μ approximately equal to or greater than the space r between the outer sides of the shoulder portions L3 of lead wires L, the outer sides of the shoulder portions L3 are always maintained within the range of a given size, i.e., the spacing between the inner sides of projections 12, 13, during the cutting operation of leg portions L1. Also, the shaping operation of trunk portions L2 of the lead wires L is by means of cutter blades 10, 11, whereby no inclination of the lead wires L is caused against the body of a component P1 which is not symmetrical so as to stabilize the chucking operation of the mounting equipment, and no cracks of the ceramic or plastic coating for the lead wires L is caused in the lead wire roots and its vicinity of a component P2 having a body of small diameter, so as to ensure the reliability and productivity of the component in the cutting and shaping operation of the cutting equipment W.

Although the present invention has been described and illustrated in detail, it is to be clearly understood that the same is not by way of limitation, the spirit and scope of the present invention being limited only by the terms of the appended claims.

What is claimed is:

1. A component lead wire cutting apparatus of the type for cutting off end portions of lead wires extending in generally the same direction from the body of an electrical component and for shaping the remaining unremoved portions of the lead wires, said apparatus comprising:

a cutter unit including first and second cutter blades movable toward each other to a closed cutting position and away from each other to an open non-cutting position;

said first and second cutter blades having thereon cooperative cutting means for, with the lead wires of an electrical component extending between said first and second cutter blades, and during movement of said first and second cutter blades from said non-cutting position thereof to said cutting position thereof, spreading said lead wires away from each other and cutting off the outer end portions of said lead wires, whereby unremoved portions of said lead wires remain connected to the body of said electrical component; and regulating means for, during said spreading apart of said lead wires, controlling the extent of movement in the spreading directions of said unremoved portions of said lead wires, and thereby for preventing excessive spreading of said unremoved portions and breaking of said body.

2. An apparatus as claimed in claim 1, wherein said cutter unit further includes first and second levers pivotally mounted at intermediate portions thereof and having connected to adjacent first ends thereof said first and second cutter blades, respectively.

3. An apparatus as claimed in claim 2, wherein said regulating means is a portion of said cutter unit.

4. An apparatus as claimed in claim 3, wherein said regulating means comprises a pair of projections on said first lever, said projections having inner facing surfaces abutting said unremoved portions of said lead wires during said spreading apart thereof.

5. An apparatus as claimed in claim 4, wherein said inner facing surfaces of said projections are spaced by a distance equal to or slightly greater than the original pitch, before said spreading, between said lead wires.

6. An apparatus as claimed in claim 4, wherein said regulating means further comprises a pair of recesses in said second lever to receive said pair of projections during said spreading.

7. An apparatus as claimed in claim 4, wherein said projections are positioned between said cutter blades and said body.

8. An apparatus as claimed in claim 1, wherein: said cutting means comprises a convex portion on said first cutter blade and a cooperative concave portion in said second cutter blade, said convex and concave portions being defined by cooperative cutting edges.

* * * * *